(12) United States Patent
Lee et al.

(10) Patent No.: US 11,978,704 B2
(45) Date of Patent: May 7, 2024

(54) WIRING STRUCTURE AND ELECTRONIC DEVICE EMPLOYING THE SAME

(71) Applicant: Samsung Electronics Co., Ltd., Suwon-si (KR)

(72) Inventors: Changseok Lee, Siheung-si (KR); Hyeonjin Shin, Suwon-si (KR); Seongjun Park, Seoul (KR); Donghyun Im, Suwon-si (KR); Hyun Park, Hwaseong-si (KR); Keunwook Shin, Yongin-si (KR); Jongmyeong Lee, Seongnam-si (KR); Hanjin Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/933,544

(22) Filed: Jul. 20, 2020

(65) Prior Publication Data

US 2020/0350256 A1 Nov. 5, 2020

Related U.S. Application Data

(63) Continuation of application No. 14/625,282, filed on Feb. 18, 2015, now abandoned.

(30) Foreign Application Priority Data

Feb. 19, 2014 (KR) .................. 10-2014-0019211
Oct. 30, 2014 (KR) .................. 10-2014-0149331

(51) Int. Cl.
*H01L 23/532* (2006.01)

(52) U.S. Cl.
CPC .. *H01L 23/53276* (2013.01); *H01L 23/53238* (2013.01); *H01L 23/53252* (2013.01); *H01L 23/53266* (2013.01); *H01L 2924/0002* (2013.01)

(58) Field of Classification Search
CPC ......... H01L 23/53276; H01L 23/53238; H01L 23/53252; H01L 23/53266; H01L 2924/0002
See application file for complete search history.

(56) References Cited

U.S. PATENT DOCUMENTS 6,982,132 B1  1/2006  Goldner et al.
8,440,999 B2  5/2013  Dimitrakopoulos et al.
(Continued)

FOREIGN PATENT DOCUMENTS

CN    103140439 A    6/2013
EP    2584075 A2     4/2013
(Continued)

OTHER PUBLICATIONS

Korean Office Action for corresponding Korean Patent Application No. 10-2014-0149331 dated Oct. 21, 2020.
(Continued)

*Primary Examiner* — Ahmed N Sefer
(74) *Attorney, Agent, or Firm* — Harness, Dickey & Pierce, P.L.C.

(57) ABSTRACT

Example embodiments relate to a wiring structure, a method of forming the same, and an electronic device employing the same. The wiring structure includes a first conductive material layer and a nanocrystalline graphene layer on the first conductive material layer in direct contact with the metal layer.

30 Claims, 9 Drawing Sheets

(56) References Cited

U.S. PATENT DOCUMENTS

| | | | |
|---|---|---|---|
| 8,476,765 B2 | 7/2013 | Zhang et al. | |
| 9,371,234 B2 | 6/2016 | Hong et al. | |
| 9,887,020 B2 | 2/2018 | Shin et al. | |
| 2007/0102111 A1* | 5/2007 | Monsma | B82Y 40/00 156/296 |
| 2009/0155561 A1 | 6/2009 | Choi et al. | |
| 2009/0257265 A1 | 10/2009 | Chen et al. | |
| 2009/0294759 A1* | 12/2009 | Woo | H01L 29/1606 257/29 |
| 2010/0032638 A1 | 2/2010 | Xu | |
| 2011/0108609 A1* | 5/2011 | Woo | B82Y 30/00 204/192.15 |
| 2011/0127471 A1 | 6/2011 | Shin et al. | |
| 2011/0253969 A1 | 10/2011 | Dai et al. | |
| 2011/0287336 A1 | 11/2011 | Himeno et al. | |
| 2012/0006580 A1* | 1/2012 | Sandhu | H01L 21/76865 977/734 |
| 2012/0049370 A1* | 3/2012 | Wada | H01L 21/76877 438/643 |
| 2012/0080086 A1 | 4/2012 | Yoon et al. | |
| 2012/0080661 A1 | 4/2012 | Saito et al. | |
| 2012/0104352 A1 | 5/2012 | Aoyama et al. | |
| 2012/0128983 A1* | 5/2012 | Yoon | B82Y 40/00 977/734 |
| 2012/0139114 A1 | 6/2012 | Zhang et al. | |
| 2012/0141799 A1 | 6/2012 | Kub et al. | |
| 2012/0193610 A1 | 8/2012 | Kim | |
| 2012/0228614 A1 | 9/2012 | Kitamura et al. | |
| 2012/0281484 A1 | 11/2012 | Cho et al. | |
| 2012/0282489 A1* | 11/2012 | Shin | H01L 21/0262 977/734 |
| 2012/0312693 A1 | 12/2012 | Veerasamy | |
| 2012/0313079 A1 | 12/2012 | Song et al. | |
| 2013/0011960 A1 | 1/2013 | Afzali-Ardakani et al. | |
| 2013/0040146 A1 | 2/2013 | Kimura et al. | |
| 2013/0048339 A1 | 2/2013 | Tour et al. | |
| 2013/0048952 A1 | 2/2013 | Chen et al. | |
| 2013/0052121 A1 | 2/2013 | Hasegawa et al. | |
| 2013/0130037 A1 | 5/2013 | Bol et al. | |
| 2013/0187097 A1 | 7/2013 | Hong et al. | |
| 2013/0189444 A1* | 7/2013 | Kub | B82Y 30/00 427/523 |
| 2013/0193408 A1 | 8/2013 | Hwang et al. | |
| 2013/0209917 A1 | 8/2013 | Himeno et al. | |
| 2013/0217226 A1 | 8/2013 | Kitamura et al. | |
| 2013/0285115 A1* | 10/2013 | Wei | H01L 21/02513 257/190 |
| 2013/0299988 A1 | 11/2013 | Bonilla et al. | |
| 2013/0327981 A1 | 12/2013 | Yamada et al. | |
| 2013/0344611 A1 | 12/2013 | Lee et al. | |
| 2014/0021195 A1 | 1/2014 | Kim et al. | |
| 2014/0141600 A1 | 5/2014 | Lee et al. | |
| 2014/0231751 A1* | 8/2014 | Wada | H01L 21/3215 257/29 |
| 2014/0291282 A1* | 10/2014 | Bedell | H01L 21/02002 216/2 |
| 2014/0342127 A1 | 11/2014 | Dimitrakopoulos et al. | |
| 2015/0004329 A1 | 1/2015 | Abuhimd | |
| 2015/0037515 A1 | 2/2015 | Fisher et al. | |
| 2015/0102807 A1* | 4/2015 | Eckinger | H01L 43/14 324/251 |
| 2015/0137076 A1* | 5/2015 | Kondo | H01L 21/043 257/29 |
| 2015/0270226 A1* | 9/2015 | Katagiri | H01L 23/53276 257/753 |
| 2015/0325524 A1* | 11/2015 | Wada | H01L 23/5283 257/750 |
| 2017/0092592 A1* | 3/2017 | Shin | H01L 23/5283 |

FOREIGN PATENT DOCUMENTS

| | | |
|---|---|---|
| KR | 20110061909 A | 6/2011 |
| KR | 10-2012-0007998 A | 1/2012 |
| KR | 20120058938 A | 6/2012 |
| KR | 20130035617 A | 4/2013 |
| KR | 20130098884 A | 9/2013 |
| KR | 20130099535 A | 9/2013 |
| KR | 10-2014-0014113 A | 2/2014 |
| WO | WO-2005-019104 A2 | 3/2005 |

OTHER PUBLICATIONS

Korean Office Action for corresponding Korean Patent Application No. 10-2014-0149331, dated May 31, 2021.

International Search Report dated May 26, 2015.

Extended European Search Report for corresponding European Application No. 15752084.2 dated Dec. 11, 2017.

Chinese Office Action for corresponding Application No. 201580020424.7 dated Oct. 23, 2018, English translation thereof.

Jesus de La Fuente, "Graphene—What is it?"Graphenea <www.graphenea.com/pages/graphene>, (2010), accessed by USPTO Jun. 9, 2016.

* cited by examiner

WIRING STRUCTURE AND ELECTRONIC DEVICE EMPLOYING THE SAME

RELATED APPLICATIONS

The present application is a continuation/divisional of and claims priority under 35 U.S.C. §§ 120/121 to U.S. patent application Ser. No. 14/625,282, filed on Feb. 18, 2015, which hereby claims priority under Korean Patent Application Nos. 10-2014-0019211, filed on Feb. 19, 2014, and 2014-149331, filed on Oct. 30, 2014, in the Korean Intellectual Property Office, the disclosure of each of which being incorporated herein in its entirety by reference.

BACKGROUND

1. Field

Example embodiments relate to a wiring structure and/or an electronic device employing the same, more particularly, example embodiments relate to a wiring structure capable of reducing a line width and decreasing a wiring resistance, and/or an electronic device employing the same.

2. Description of the Related Art

Regarding high-density and high-performance semiconductor devices, efforts to reduce a line width and a thickness of a metal wiring have been made. When the line width and the thickness of the metal wiring are reduced, the number of semiconductor chips to be accumulated for each wafer may be increased. In addition, when the thickness of the metal wiring is reduced, capacitance of a line may be decreased, and thus a sensing margin may be increased in a dynamic random access memory (DRAM) and the like.

However, when the line width and the thickness of the metal wiring are reduced, resistance typically increases. Accordingly, the importance of decreasing the resistance of a wiring structure is increased. A current interconnect technology has approached a physical limit in that a specific resistance greatly increases with a considerable decrease in the line width.

Accordingly, new materials and new processes for reducing a resistance when a wiring structure is formed may be advantageous.

SUMMARY

Example embodiments relate to a wiring structure capable of reducing a line width and a wiring resistance by including graphene, and/or an electronic device employing the wiring structure.

Additional example embodiments will be set forth in part in the description which follows and, in part, will be apparent from the description, or may be learned by practice of the example embodiments.

According to at least one example embodiment, a wiring structure includes a first conductive material layer and a nanocrystalline graphene formed on the first conductive material layer.

The nanocrystalline graphene may satisfy at least one of the following conditions: the nanocrystalline graphene has a thickness of less than 20% of a thickness of the first conductive material layer, the nanocrystalline graphene has a ratio of 2D/G of a Raman spectrum and which is equal to or greater than 0.05, the nanocrystalline graphene has a ratio of D/G that is equal to or less than 2, and the nanocrystalline graphene has a crystal size equal to or greater than 1 nm.

The nanocrystalline graphene layer may be formed on the first conductive material layer by deposition.

The nanocrystalline graphene layer may be doped with a doping element.

The doping element may include at least one of $NO_2BF_4$, $NOBF_4$, $NO_2SbF_6$, HCl, $H_2PO_4$, $CH_3COOH$, $H_2SO_4$, $HNO_3$, dichlorodicyanoquinone, oxon, dimyristoylphosphatidylinositol, and trifluoromethanesulfonic imide; an inorganic p-dopant group constituted by $HPtCl_4$, $AuCl_3$, $HAuCl_4$, AgOTfs, $AgNO_3$, $H_2PdCl_6$ $Pd(OAc)_2$, and $Cu(CN)_2$, an organic n-dopant group constituted by a reduced substance of substituted or unsubstituted nicotinamide, a reduced substance of a compound chemically bonded to substituted or unsubstituted nicotinamide, a compound containing two or more pyridinum derivatives in a molecular structure and containing a reduced nitrogen within a ring of at least one pyridinum derivative, (2,3-dichloro-5,6-dicyano-1,4-benzoquinone) DDQ and (benzyl viologen) BV.

The first conductive material layer may be formed as a single layer or a multi-layer by using a material including a transition metal containing Ni, Cu, Co, Fe, or Ru, at least one of TiN, W, NiSi, CoSi, CuSi, FeSi, MnSi, RuSi, RhSi, IrSi, PtSi, TiSi, and WSi, or an alloy thereof, or Poly-Si.

The nanocrystalline graphene may be formed on the first conductive material layer to be in direct contact with the first conductive material layer.

The first conductive material layer may be or include a metal layer.

The wiring structure may further include a seed layer formed on the first conductive material layer. The nanocrystalline graphene may be directly grown on the seed layer.

The seed layer may be or include a metal-carbon bonding layer.

The seed layer may have a thickness equal to or less than 1 nm.

The wiring structure may further include a second conductive material layer formed on the nanocrystalline graphene.

The wiring structure may further include a graphene layer transferred onto the nanocrystalline graphene.

The first conductive material layer may include a Poly-Si layer and a metal layer, and the second conductive material layer may be formed of or include a metal material.

The metal layer may include TiN or TiSiN, the second conductive material layer may include W, and the seed layer may be formed of Ti—C.

The first conductive material layer may include a Poly-Si layer, and the second conductive material layer may be formed of or include a metal material.

The second conductive material layer may include W, and the seed layer may be formed of or include Si—C.

The first conductive material layer may be formed of or include a single layer or a multi-layer using a material including a transition metal containing Ni, Cu, Co, Fe, or Ru, at least one of TiN, W, NiSi, CoSi, CuSi, FeSi, MnSi, RuSi, RhSi, IrSi, PtSi, TiSi, TiSiN, and WSi, or an alloy thereof, or Poly-Si.

According to another example embodiment, a wiring structure includes a conductive material layer, a nanocrystalline graphene formed on the conductive material layer to be in direct contact with the conductive material layer, and a graphene layer formed on the nanocrystalline graphene.

The nanocrystalline graphene layer may satisfy at least one of the following conditions: the nanocrystalline graphene has a thickness of less than 20% of a thickness of the conductive material layer, the nanocrystalline graphene has a ratio of 2D/G of a Raman spectrum and which is equal to or greater than 0.05, the nanocrystalline graphene has a ratio of D/G that is equal to or less than 2, and the nanocrystalline graphene has a crystal size equal to or greater than 1 nm.

The nanocrystalline graphene may be on the conductive material layer by deposition.

The nanocrystalline graphene may be formed after removing a natural oxide film on the conductive material layer.

The natural oxide film may be removed by reduction.

The graphene layer may be formed by transferring graphene which is separately grown.

The graphene layer may be configured as single-layered to thirty-layered graphene.

The graphene layer may have a thickness of equal to or less than 10 nm.

At least one of the graphene layer and the nanocrystalline graphene may be doped with a doping element.

The doping element may include at least one organic p-dopant group constituted by $NO_2BF_4$, $NOBF_4$, $NO_2SbF_6$, HCl, $H_2PO_4$, $CH_3COOH$, $H_2SO_4$, $HNO_3$, dichlorodicyanoquinone, oxon, dimyristoylphosphatidylinositol, and trifluoromethanesulfonic imide, an inorganic p-dopant group constituted by $HPtCl_4$, $AuCl_3$, $HAuCl_4$, $AgOTfs$, $AgNO_3$, $H_2PdCl_6$ $Pd(OAc)_2$, and $Cu(CN)_2$, an organic n-dopant group constituted by a reduced substance of substituted or unsubstituted nicotinamide, a reduced substance of a compound chemically bonded to substituted or unsubstituted nicotinamide, and a compound containing two or more pyridinum derivatives in a molecular structure and containing a reduced nitrogen within a ring of at least one pyridinum derivative, DDQ and BV.

The conductive material layer may be formed as a single layer or a multi-layer by using a material including a transition metal containing Ni, Cu, Co, Fe, or Ru, at least one of TiN, W, NiSi, CoSi, CuSi, FeSi, MnSi, RuSi, RhSi, IrSi, PtSi, TiSi, TiSiN, and WSi, or an alloy thereof, or Poly-Si.

According to another example embodiment, an electronic device includes the above-described wiring structure.

The electronic device may further include a plurality of elements. Each of the plurality of elements may include at least one of a transistor, a capacitor, and a resistor. The wiring structure may be used for connection between the plurality of elements or connection within each of the elements.

The wiring structure may be used for connection between unit cells each constituted by a combination of the plurality of elements.

The wiring structure may be used for connection between chips each constituted by the unit cells.

The electronic device may further include a plurality of elements. Each of the plurality of elements may include at least one of a transistor, a capacitor, and a resistor. The wiring structure may be used for connection between unit cells each constituted by a combination of the plurality of elements.

The electronic device may further include a plurality of elements. Each of the plurality of elements may include at least one selected from the group consisting of a transistor, a capacitor, and a resistor. The wiring structure may be used for connection between unit cells each constituted by a combination of the plurality of elements.

According to at least one example embodiment, a wiring structure includes a metal layer, a native metal oxide thereof being substantially removed from a surface thereof; and a nanocrystalline graphene on the metal layer in direct contact with a metallic surface of the metal layer.

BRIEF DESCRIPTION OF THE DRAWINGS

These and/or other example embodiment will become apparent and more readily appreciated from the following description of the example embodiments, taken in conjunction with the accompanying drawings in which.

DETAILED DESCRIPTION

Figure 1:
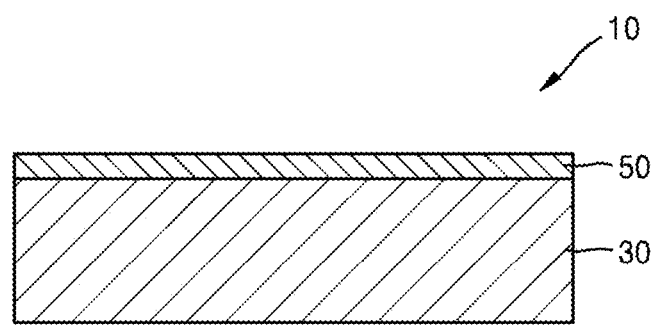
FIG. 1 a schematic cross-sectional view illustrating a wiring structure according to at least one example embodiment.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Graphene, which is a two-dimensional material, forms a hybrid structure in conjunction with a conductive material, for example, a metal or Poly-Si which may be used for a wiring structure, and thus, a line width and a resistance of a wiring may be reduced. As the thickness of a metal decreases, a specific resistance thereof typically greatly increases. On the other hand, graphene has a fixed specific resistance regardless of the thickness thereof. Accordingly, it is possible to reduce a specific resistance of a wiring structure by inserting graphene between actual wiring structures of the multi-stack structure.

Examples of the metal used for a wiring structure include TiN, W, W—Pd, WSiX, TiSiN, Co, Ru, Cu, Ni, NiSi, CoSi, CuSi, FeSi, MnSi, RuSi, RhSi, IrSi, PtSi, TiSi, WSi, and the like. When graphene having an excellent electrical property is transferred on a wiring, a scattering phenomenon of charges, which occurs on the surface of the metal, may be decreased. However, in a general graphene transferring process, it is typically difficult to prevent an oxide film from being formed on a surface of a metal. Unlike a silicon substrate, graphene has a weak interaction with the surface of the metal, and thus the graphene is not likely to be attached to the surface of the metal.

According to a wiring structure and a method of forming the same according to an example embodiment, the above-described problems may be solved by removing an oxide film formed on a surface of a metal and forming nanocrystalline graphene thereon.

In addition, according to the wiring structure and the method of forming the same according to an example embodiment, a graphene layer may be formed by directly growing nanocrystalline graphene on a layer formed of or including a conductive material such as, for example, a metal or Poly-Si, and transferring high-quality graphene, which is separately grown, on the nanocrystalline graphene when necessary. Thus, a process condition limit may be overcome at the time of forming the wiring structure. For example, when an electronic device having the wiring structure according to the example embodiment applied thereto is a memory device, a process temperature for forming the wiring structure is limited to approximately 700° C. As is well known, in order to grow high-quality graphene, a growth temperature of approximately 900° C. to 1000° C. is required, and a catalyst metal is also limited. Since nanocrystalline graphene may be grown without catalyst metal limitations under a process temperature limited to approximately 700° C., the wiring structure according to the example embodiment may be applied to a memory device and the like without process temperature limitations.

Reference will now be made in detail to example embodiments illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain example embodiments.

FIG. 1 a schematic cross-sectional view illustrating a wiring structure 10 according to an example embodiment.

Referring to FIG. 1, the wiring structure 10 according to the example embodiment includes a conductive material layer 30 and a nanocrystalline graphene 50, which is formed so as to come into direct contact with the conductive material layer 30.

The conductive material layer 30 may be a metal layer formed of various metals that may be used for a wiring structure in an electronic device. For example, the conductive material layer 30 may include a single-layered structure or a multi-layered structure using a material including a transition metal containing Ni, Cu, Co, Fe, or Ru, at least one of TiN, W, NiSi, CoSi, CuSi, FeSi, MnSi, RuSi, RhSi, IrSi, PtSi, TiSi, and WSi, or an alloy thereof, for example, W—Pd, WSiX, and TiSiN. The conductive material layer 30 may be formed of or include not only of a metal but also other conductive materials, for example, Poly-Si.

The nanocrystalline graphene 50 may be formed on the conductive material layer 30 by deposition, for example. The nanocrystalline graphene 50 may be formed so as to satisfy at least one of the following conditions: the nanocrystalline graphene 50 has a thickness of less than 20% of the thickness of the conductive material layer 30, the nanocrystalline graphene 50 has a ratio of 2D/G of a Raman spectrum and which is equal to or greater than 0.05, the nanocrystalline graphene 50 has a ratio of D/G that is equal to or less than 2, and the nanocrystalline graphene 50 has a crystal size equal to or greater than 1 nm. For example, the nanocrystalline graphene may have a crystal size of approximately 1 nm to 100 nm.

The nanocrystalline graphene 50 may be doped with a doping element so as to reduce resistance of the wiring structure 10 according to an example embodiment. For example, the doping may be formed by spin coating using a doping element.

In the wiring structure 10 according to the example embodiment, the doping element may include, for example, $AuCl_3$, DDQ, BV, and the like. Here, $AuCl_3$ is a p-type doping element (dopant) and BV is an n-type doping element (dopant).

Furthermore, various types of p-type or n-type doping elements may be used to dope the nanocrystalline graphene 50 of the wiring structure 10 according to the example embodiment.

According to at least one example embodiment, various types of organic and/or inorganic dopants may be used as the doping element. For example, the doping element may include at least one organic p-dopant group constituted by $NO_2BF_4$, $NOBF_4$, $NO_2SbF_6$, HCl, $H_2PO_4$, $CH_3COOH$, $H_2SO_4$, $HNO_3$, dichlorodicyanoquinone, oxon, dimyristoylphosphatidylinositol, and trifluoromethanesulfonic imide; an inorganic p-dopant group constituted by $HPtCl_4$, $AuCl_3$, $HAuCl_4$, $AgOTfs$, $AgNO_3$, $H_2PdCl_6$ $Pd(OAc)_2$, and $Cu(CN)_2$; and an organic n-dopant group constituted by a reduced substance of substituted or unsubstituted nicotinamide, a reduced substance of a compound chemically bonded to substituted or unsubstituted nicotinamide, and a compound containing two or more pyridinium derivatives in a molecular structure and containing a reduced nitrogen within a ring of at least one pyridinum derivative.

Here, the compound chemically bonded to a reduced substance of nicotinamide may be NMNH, NADH, or NADPH.

In addition, the compound containing two or more pyridinum derivatives in a molecular structure and containing a reduced nitrogen within a ring of at least one pyridinum derivative may be viologen. Here, the viologen may be one of 1,1'-dibenzyl-4,4'-bipyridinium chloride, methyl viologen dichloride hydrate, ethyl viologen diperchlorate, 1,1'dioctadecyl-4,4'-bipyridinium dibromide, and dioctylbis 4-pyridyl)biphenyl viologen. Furthermore, the viologen may have a conjugable molecular structure in the middle of a bipyridyl structure. For example, the conjugable molecular structure may include aryl, akenyl, or akynyl.

Figure 2:
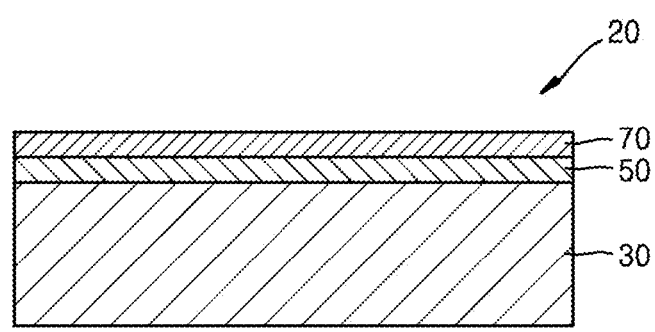
FIG. 2 is a schematic cross-sectional view illustrating a wiring structure according to another example embodiment.

FIG. 2 is a schematic cross-sectional view illustrating a wiring structure 20 according to another example embodiment. Compared with the wiring structure 10 of FIG. 1, the wiring structure 20 further includes a graphene layer 70 formed on a nanocrystalline graphene 50. Here, the substantially same components as those in FIG. 1 are denoted by the same reference numerals, and a repeated description thereof will be omitted.

Referring to FIG. 2, in the wiring structure 20 according to the example embodiment, the graphene layer 70 may be formed by transferring high-quality graphene which is separately grown. At this time, for example, the graphene layer 70 may be configured as single-layered to thirty-layered graphene. For example, the graphene layer 70 may be configured as multilayer graphene (MLG). The graphene layer 70 may have a thickness equal to or less than approximately 10 nm.

In the wiring structure 20 according to the example embodiment as illustrated in FIG. 2, at least one of the graphene layer 70 and the nanocrystalline graphene 50 may be doped with a doping element so as to further reduce resistance of the wiring structure 20.

In the wiring structure 20 according to the example embodiment, doping may be performed, for example, by spin coating using a doping element.

In the wiring structure 20 according to the example embodiment, a doping element may include, for example, $AuCl_3$, DDQ, BV, and the like. Here, $AuCl_3$ is a p-type doping element (dopant) and BV is an n-type doping element (dopant).

Furthermore, various types of p-type or n-type doping elements may be used to dope at least one of the graphene layer 70 and the nanocrystalline graphene 50 of the wiring structure 20, according to the example embodiment.

That is, various types of organic and/or inorganic dopants may be used as the doping element. For example, the doping element may include at least one organic p-dopant group constituted by $NO_2BF_4$, $NOBF_4$, $NO_2SbF_6$, HCl, $H_2PO_4$, $CH_3COOH$, $H_2SO_4$, $HNO_3$, dichlorodicyanoquinone, oxon, dimyristoylphosphatidylinositol, and trifluoromethanesulfonic imide; an inorganic p-dopant group constituted by $HPtCl_4$, $AuCl_3$, $HAuCl_4$, $AgOTfs$, $AgNO_3$, $H_2PdCl_6$ $Pd(OAc)_2$, and $Cu(CN)_2$; and an organic n-dopant group constituted by a reduced substance of substituted or unsubstituted nicotinamide, a reduced substance of a compound chemically bonded to substituted or unsubstituted nicotinamide, and a compound containing two or more pyridinum derivatives in a molecular structure and containing a reduced nitrogen within a ring of at least one pyridinum derivative.

Here, the compound chemically bonded to a reduced substance of nicotinamide may be NMNH, NADH, or NADPH.

In addition, the compound containing two or more pyridinum derivatives in a molecular structure and containing reduced nitrogen within a ring of at least one pyridinum derivative may be viologen. Here, the viologen may be selected from 1,1'-dibenzyl-4,4'-bipyridinium chloride, methyl viologen dichloridehydrate, ethyl viologen diperchlorate, 1,1'dioctadecyl-4,4'-bipyridinium dibromide, and dioctylbis 4-pyridyl)biphenyl viologen. Furthermore, the viologen may have a conjugable molecular structure in the middle of a bipyridyl structure. For example, the conjugable molecular structure may include aryl, akenyl, or akynyl.

FIGS. 3A to 3D are schematic cross-sectional views illustrating a method of forming a wiring structure, according to an example embodiment. The wiring structure 10 described above with reference to FIG. 1 may be manufactured through processes shown in FIGS. 3A to 3D, and the wiring structure 20 described above with reference to FIG. 2 may be manufactured through the processes shown in FIGS. 3A to 3D.

Referring to FIGS. 3A to 3D, according to the method of forming a wiring structure of the example embodiment, first, the conductive material layer 30 is prepared, and the nanocrystalline graphene 50 is formed so as to come into direct contact with the prepared conductive material layer 30.

Figure 3A:
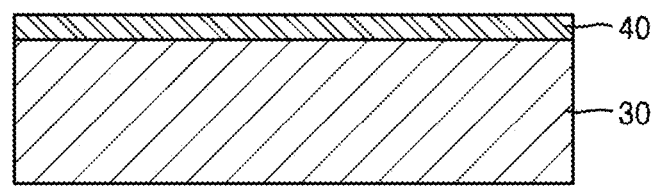
FIGS. 3A to 3D are schematic cross-sectional views illustrating a method of forming a wiring structure, according to an example embodiment.
Figure 3B:
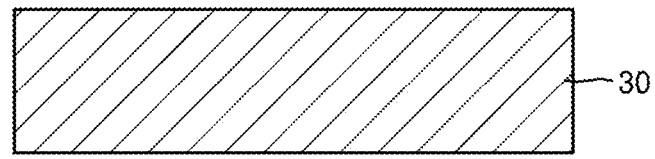

As illustrated in FIG. 3A, a natural oxide film 40 may be formed on the surface of the conductive material layer 30. In this manner, when the natural oxide film 40 is present on the surface of the conductive material layer 30 constituting the wiring structure 10, the natural oxide film 40 may be removed so that the nanocrystalline graphene 50 is formed so as to come into direct contact with the conductive material layer 30, as illustrated in FIG. 3B.

The conductive material layer 30 may be formed of various metals that may be used for a wiring structure in an electronic device. For example, the conductive material layer 30 may have a single-layered structure or a multi-layered structure using a material a transition metal containing Ni, Cu, Co, Fe, or Ru, at least one of TiN, W, NiSi, CoSi, CuSi, FeSi, MnSi, RuSi, RhSi, IrSi, PtSi, TiSi, and WSi, or an alloy thereof, for example, W—Pd, WSiX, or TiSiN. The conductive material layer 30 may be formed of or include not only a metal but also of other types of conductive materials, for example, Poly-Si.

In this manner, the conductive material layer 30 may be formed of various metals such as Ti, W, W—Pd, WSiX, TiN, TiSiN, Co, NiSi, CoSi, CuSi, FeSi, MnSi, RuSi, RhSi, IrSi, PtSi, TiSi, or WSi, in addition to Cu, Ni, and Ru, which are catalyst metals used to grow graphene. That is, the conductive material layer 30 may be formed of all kinds of metals used for a wiring structure. In addition, the conductive material layer 30 may be formed of not only a metal but also of other types of conductive materials, for example, Poly-Si.

The natural oxide film 40 may be formed in the surface of the conductive material layer 30, for example, a metal layer, so as to have a thickness of approximately 1 nm to 2 nm, and the natural oxide film 40 may be removed by a reduction process. For example, the natural oxide film 40 may be removed by a reduction process using a hydrogen plasma ($H_2$ plasma) process.

Figure 3C:
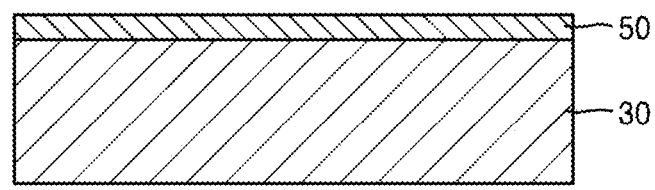

In this manner, as illustrated in FIG. 3C, the nanocrystalline graphene 50 (n-C graphene) may be formed on the conductive material layer 30, from which the natural oxide film 40 is removed, by deposition. That is, the nanocrystalline graphene 50 may be directly grown on the surface of the conductive material layer The nanocrystalline graphene 50 may be formed so as to satisfy at least one of the following conditions: the nanocrystalline graphene 50 has a thickness of less than 20% of the thickness of the conductive material layer 30, the nanocrystalline graphene 50 has a ratio of 2D/G of a Raman spectrum being equal to or greater than 0.05, the nanocrystalline graphene 50 has a ratio of D/G being equal to or less than 2, and the nanocrystalline graphene 50 has a crystal size being equal to or greater than 1 nm. For example, the nanocrystalline graphene 50 may have a crystal size of approximately 1 nm to 100 nm.

The nanocrystalline graphene 50 may be formed by a low temperature process. For example, the nanocrystalline graphene 50 may be deposited through a low-temperature graphene growth process using plasma. As described above, in order to grow high-quality graphene, a growth temperature of approximately 900° C. to 1000° C. is required, while the nanocrystalline graphene 50 may be deposited on the conductive material layer 30 through a low-temperature process of approximately 700° C. or less.

In this manner, the natural oxide film 40 may be removed through a reduction process in a temperature range lower than a general graphene growth temperature, and then the nanocrystalline graphene 50 may be immediately deposited in a low temperature range. At this time, the reduction process of removing the natural oxide film 40 and the deposition of the nanocrystalline graphene 50 may be performed within the same chamber. Accordingly, the nanocrystalline graphene 50 may be deposited so as to come into direct contact with the surface of the conductive material layer 30 from which the natural oxide film 40 is removed.

As described above, according to at least one example embodiment, when the reduction process of removing the natural oxide film 40 and the deposition of the nanocrystalline graphene 50 are performed within the same chamber, the surface of the conductive material layer 30 may be maintained in a state where an oxide film is not formed.

As described above, when the nanocrystalline graphene 50 is directly grown on the surface of the conductive material layer 30 from which the natural oxide film 40 is removed, the wiring structure 10 according to the example embodiment, which is described above with reference to FIG. 1, may be obtained. In this manner, the nanocrystalline graphene 50 is directly grown on the surface of the conductive material layer 30, and then may be doped with a doping element as described above.

Figure 3D:
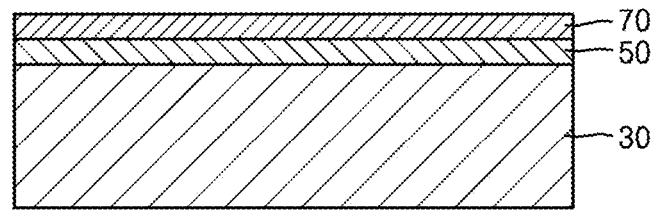

According to the method of forming a wiring structure of the example embodiment, the nanocrystalline graphene 50 is directly grown on the surface of the conductive material layer 30, and then high-quality graphene, which is separately grown, is transferred thereon through, for example, a transferring process, thereby further forming the graphene layer 70 as illustrated in FIG. 3D. In this manner, when the graphene layer 70 is further formed on the nanocrystalline graphene 50 through a transferring process, the wiring structure 20 according to another example embodiment may be obtained as described above with reference to FIG. 2.

At this time, for example, the graphene layer 70 may be configured as single-layered to thirty-layered graphene. For example, the graphene layer 70 may be configured as an MLG. The graphene layer 70 may have a thickness equal to or less than approximately 10 nm.

As described above, the nanocrystalline graphene 50 is grown on the conductive material layer 30 so as to come into contact with the conductive material layer 30, for example, by deposition, and high-quality graphene, which is separately grown, is transferred on the nanocrystalline graphene 50, for example, through a transferring process, to thereby form the graphene layer 70 when necessary.

At this time, the graphene layer 70 is formed on the nanocrystalline graphene 50 through a transferring process, and then, for example, at least one of the nanocrystalline graphene 50 and the graphene layer 70 may be doped with the above-described doping element.

According to at least one example embodiment, graphene has a significantly low adhesive strength during a transferring process. However, the nanocrystalline graphene 50 applied to the wiring structures according to the example embodiments improves an adhesion strength to the high-quality graphene layer 70 placed thereon, in addition to preventing an oxide film from being generated on a conductive material, for example, the metal.

According to the above-described method of forming the wiring structures 10 and 20 of the example embodiments, graphene with an excellent electrical characteristic is applied to a wiring structure, and thus it is possible to reduce specific resistance and a thickness of a wiring.

Figure 4A:
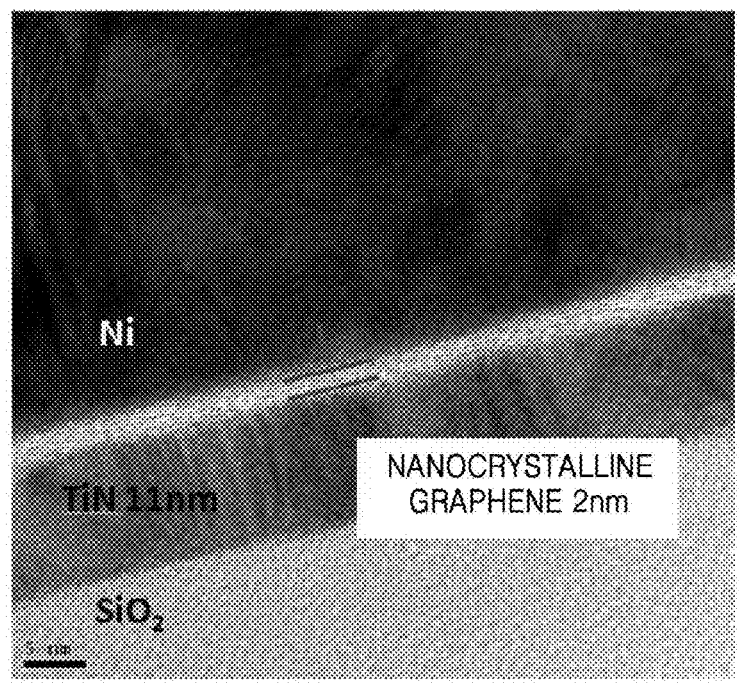
FIG. 4A is a transmission electron microscope image showing a cutting plane of a sample in which nanocrystalline graphene is deposited on TiN.
Figure 4B:
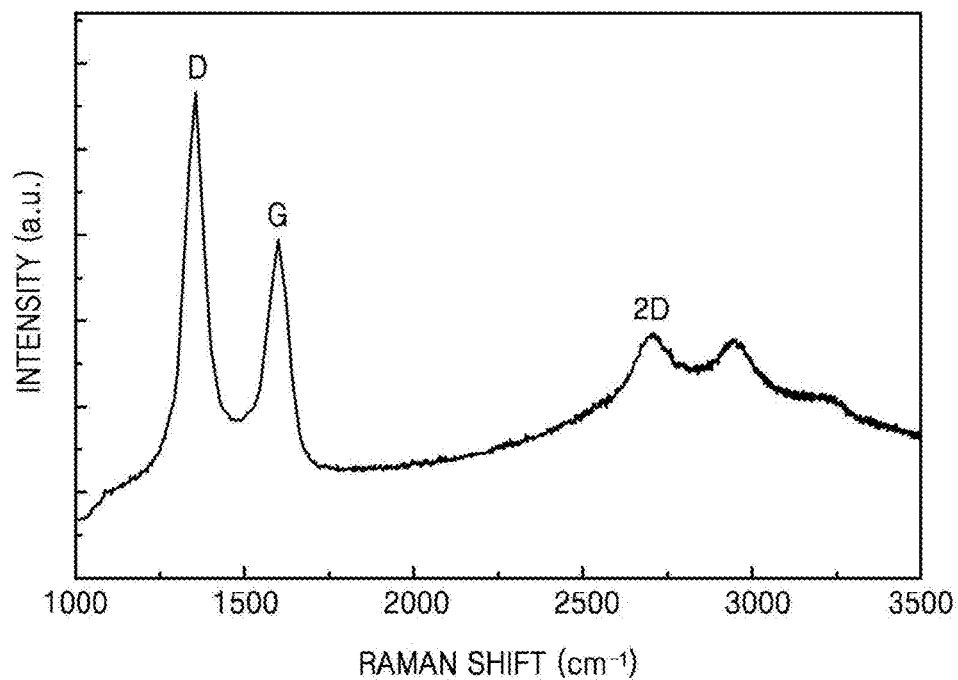
FIG. 4B is a graph showing measurement results of a Raman spectrum of the sample of FIG. 4A.

FIG. 4A is a transmission electron microscope image showing a cutting plane of a sample in which nanocrystalline graphene is deposited on TiN, and FIG. 4B is a graph showing measurement results of a Raman spectrum of the sample of FIG. 4A.

Referring to FIGS. 4A and 4B, in a sample in which nanocrystalline graphene is deposited on a TiN thin film having a thickness of approximately 11 nm, the nanocrystalline graphene has a thickness of approximately 2 nm, and a D peak, a G peak, and a 2D peak are shown from the left in the measurement results of the Raman spectrum. A crystal size may be calculated from the ratio of the D peak to the G peak, and the calculated crystal size is an order of nm, and thus it is seen that the nanocrystalline graphene is formed.

The nanocrystalline graphene may have a crystal size of, for example, approximately a nanometer level. For example, the nanocrystalline graphene may have a crystal size of approximately 1 nm to approximately 100 nm. On the other hand, general graphene may have a crystal size of equal to or greater than approximately a micrometer level.

According to the method of forming the wiring structures of the example embodiments, the natural oxide film 40 formed on a wiring metal used for a wiring structure is removed, and the nanocrystalline graphene 50 is directly grown thereon, and then high-quality graphene is transferred on the nanocrystalline graphene 50 when necessary, thereby realizing a wiring structure having a high adhesive strength to a surface of a metal and having a reduced resistance of a wiring.

According to the method of forming a wiring structure of the example embodiment, the nanocrystalline graphene 50 may be p-type or n-type doped so as to further reduce resistance. The nanocrystalline graphene 50 has a wider active site to which a dopant may be bounded, that is, a grain boundary, and has a higher defect density than general graphene, and thus an effective doping process may be performed.

General graphene is a polycrystalline material and has a crystal size that is equal to or greater than approximately micrometer level. In order to dope graphene, other elements, ions, molecules, or the like have to be bonded to a grain boundary and a defect region. According to the example embodiment, the nanocrystalline graphene 50 has a size of approximately nanometer level. Accordingly, the nanocrystalline graphene 50 has a lot of sites to which a dopant is bonded, and thus a doping effect may be greatly increased.

According to the method of forming a wiring structure of the example embodiment, in a structure in which the graphene layer 70 is provided on the nanocrystalline graphene 50, at least one of the nanocrystalline graphene 50 and the graphene layer 70 may be p-type or n-type doped so as to reduce resistance.

Accordingly, when the nanocrystalline graphene 50 or at least one selected from the group consisting of the nanocrystalline graphene 50 and the graphene layer 70 is p-type or n-type doped, resistance of the wiring structure according to the example embodiment may be further reduced.

According to the example embodiment, doping may be performed, by spin coating. For example, a case may be considered where the nanocrystalline graphene 50 or a stacked structure of the nanocrystalline graphene 50 and the graphene layer 70 is doped with $AuCl_3$ by spin coating. When being coated with $AuCl_3$ by spin coating, gold ions are attached to the surface thereof, and all other components are eliminated.

Table 1 shows a structure (sample 2) in which nanocrystalline graphene is directly grown on a TiN layer by using a TiN layer (sample 1) having a thickness of approximately 11 nm as the conductive material layer 30, and structures (sample 3, sample 4, and sample 5) in which a graphene layer is formed by transferring graphene separately on the nanocrystalline graphene/TiN structure, and shows change in sheet resistance in a case where the sample 3, the sample 4, and the sample 5 are doped. In this example, the doping is performed by spin coating using $AuCl_3$ of 10 mM. In addition, nanocrystalline graphene is grown on TiN having a thickness of approximately 11 nm for approximately 20 minutes at a growth temperature of approximately 700° C.

TABLE 1

| No. | Structure of Sample | Sheet Resistance a (ohm/sq.) | Equivalent TiN thickness | Sheet Resistance b (ohm/sq.) | Rate of Decrease α* (%) | Structure of Sample | Sheet Resistance c (ohm/sq.) | Rate of Decrease β* (%) |
|---|---|---|---|---|---|---|---|---|
| Sample 1 | TiN 11 nm | 88.60 | | | | TiN 11 nm | | |
| Sample 2 | nanocrystalline grapheme/ TiN 11 nm | 69.95 | TiN 13.0 nm | 75.04 | 6.8%↓ | nanocrystalline grapheme/ TiN 11 nm | | |

TABLE 1-continued

| No. | Structure of Sample | Sheet Resistance a (ohm/sq.) | Equivalent TiN thickness | Sheet Resistance b (ohm/sq.) | Rate of Decrease α* (%) | Structure of Sample | Sheet Resistance c (ohm/sq.) | Rate of Decrease β* (%) |
|---|---|---|---|---|---|---|---|---|
| Sample 3 | one sheet of graphene/ nanocrystalline grapheme/ TiN 11 nm | 63.91 | TiN 13.3 nm | 72.22 | 11.5%↓ | doping/one sheet of graphene/ nanocrystalline grapheme/ TiN 11 nm | 49.83 | 31.0%↓ |
| Sample 4 | two sheets of graphene/ nanocrystalline graphene/ TiN 11 nm | 58.64 | TiN 13.6 nm | 69.57 | 15.7%↓ | doping/two sheets of graphene/ nanocrystalline graphene/ TiN 11 nm | 41.03 | 41.0%↓ |
| Sample 5 | three sheets of graphene/ nanocrystalline graphene/ TiN 11 nm | 56.80 | TiN 13.9 nm | 67.08 | 15.3%↓ | doping/three sheets of graphene/ nanocrystalline graphene/ TiN 11 nm | 36.60 | 45.4%↓ |

*Rate of Decrease α (%) = (Sheet Resistance b − Sheet Resistance a)/Sheet Resistance b × 100
*Rate of Decrease β (%) = (Sheet Resistance b − Sheet Resistance c)/Sheet Resistance b × 100

Referring to Table 1, it is seen that the nanocrystalline graphene/TiN structure (sample 2) has a sheet resistance which is approximately 6.8% lower than the sheet resistance of the structure including only a TiN layer (sample 1). When a graphene layer is formed on the nanocrystalline graphene/TiN structure, it is seen that sheet resistance is reduced by about 11.5% (sample 3), about 15.7% (sample 4), and about 15.3% (sample 5). In addition, when sample 3, sample 4, and sample 5 are doped, it is seen that sheet resistance is greatly reduced by approximately 31.0%, approximately 41.0%, and approximately 45.4%, respectively. In this example, sample 3 shows a structure of one sheet of graphene sheet/nanocrystalline graphene/TiN, sample 4 shows a structure of two sheets of graphene/nanocrystalline graphene/TiN, and sample 5 shows a structure of three sheets of graphene/nanocrystalline graphene/TiN.

As seen from Table 1, the resistance of the wiring structure may be reduced by directly growing the nanocrystalline graphene 50 having a crystal size of approximately nanometer level on the conductive material layer 30. In addition, the resistance of the wiring structure may be further reduced by further forming the graphene layer 70 on the stacked structure of the nanocrystalline graphene 50 and the conductive material layer 30, and the resistance may be greatly reduced by doping the nanocrystalline graphene 50 or the stacked structure of the nanocrystalline graphene 50 and the graphene layer 70.

The wiring structures 10 and 20 according to example embodiments may be used to connect wirings to each other in an electronic device.

At this time, the electronic device includes a plurality of elements, and each of the plurality of elements includes at least one of a transistor, a capacitor, and a resistor. The wiring structure may be used for connection between the plurality of elements and connection within each of the elements.

As a specific example, the wiring structure may be used for connection between unit cells each constituted by a combination of the plurality of elements. In addition, the wiring structure may be used for connection between chips each constituted by the plurality of unit cells. Furthermore, the electronic device includes a plurality of elements, and each of the plurality of elements includes at least one of a transistor, a capacitor, and a resistor and the wiring structure may be used for connection between unit cells each constituted by a combination of the plurality of elements. In addition, the electronic device includes a plurality of elements, and each of the plurality of elements may include at least one of a transistor, a capacitor, and a resistor and the wiring structure may be used for connection between chips each constituted by the plurality of unit cells of which each is constituted by a combination of the plurality of elements.

Figure 5:
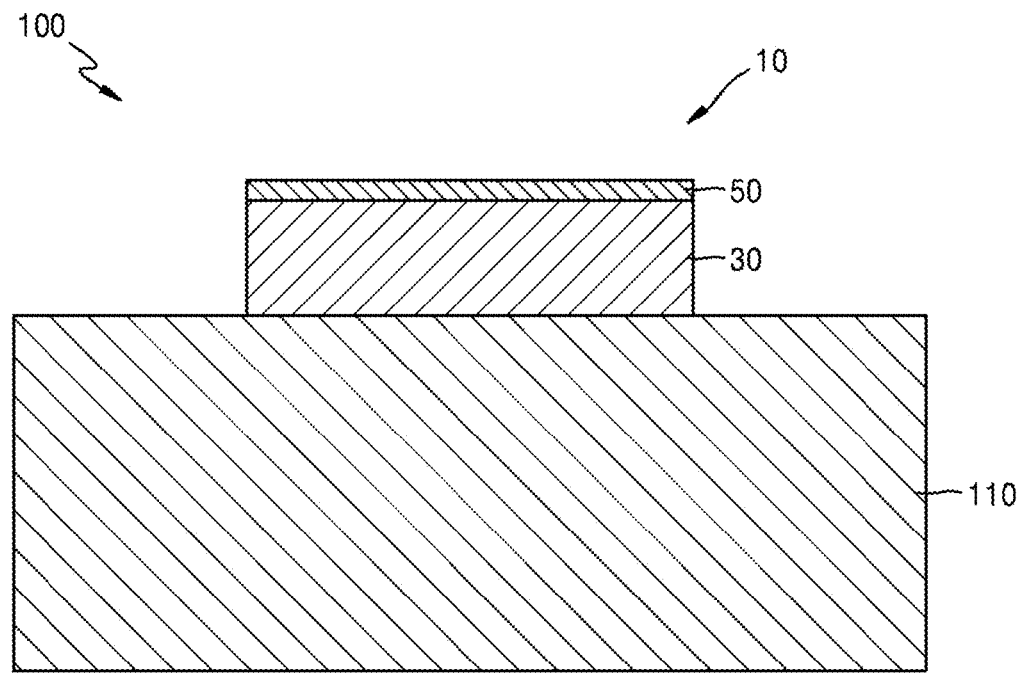
FIG. 5 illustrates an example of an electronic device having the wiring structure of FIG. 1.
Figure 6:
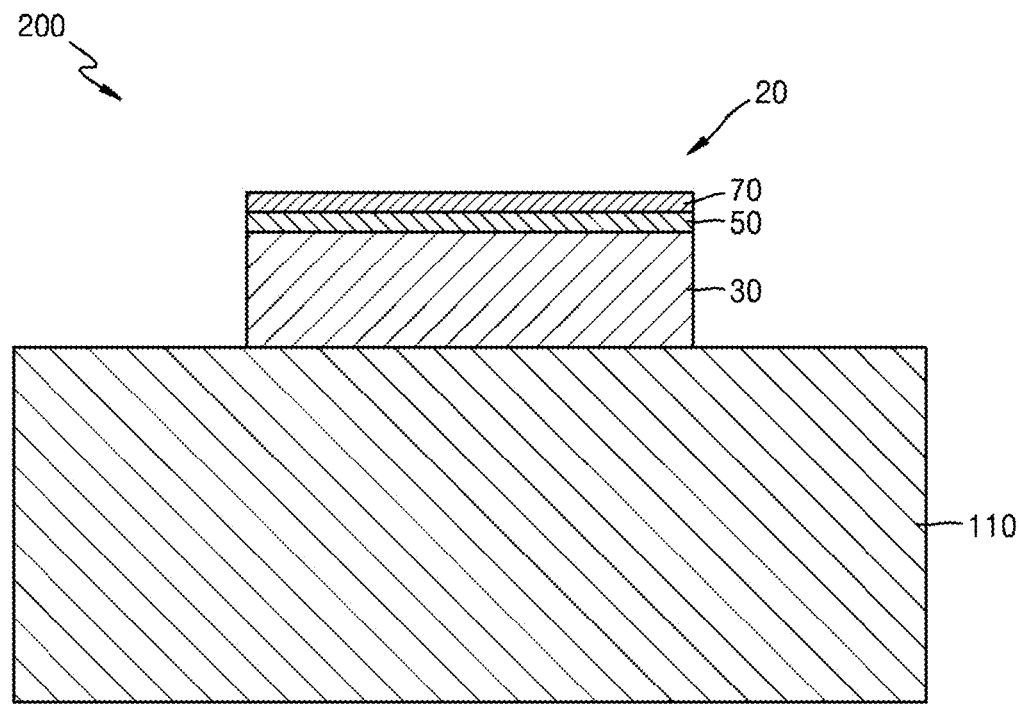
FIG. 6 illustrates an example of an electronic device having the wiring structure of FIG. 2.

FIGS. 5 and 6 schematically illustrate electronic devices 100 and 150 having the wiring structures 10 and 20 according to example embodiments applied thereto, respectively. FIG. 5 illustrates an example of the electronic device 100 having the wiring structure 10 of FIG. 1 applied thereto, and FIG. 6 illustrates an example of the electronic device 150 having the wiring structure 20 of FIG. 2.

Referring to FIGS. 5 and 6, the electronic devices 100 and 150 each include a base structure 110 and the wiring structures 10 and 20 being formed on the base structure 110 interconnect.

The base structure 110 may be a substrate used to manufacture a semiconductor device, for example, a semiconductor substrate, a glass substrate, or a plastic substrate. In addition, the base structure 110 may be a semiconductor layer, an insulating layer, or the like which is formed on a substrate. Alternatively, the base structure 110 may be configured such that at least one of the plurality of elements constituting the electronic device 100 or the plurality of elements are disposed on a substrate.

For example, the base structure 110 may include a plurality of elements. In addition, the base structure 110 may include a unit cell constituted by a combination of the plurality of elements or may include a plurality of cells.

Accordingly to at least one example embodiment, each of the plurality of elements may include at least one of a transistor, a capacitor, and a resistor.

As described above with reference to FIG. 1, the wiring structure 10 may include the conductive material layer 30 and the nanocrystalline graphene 50 which is formed on the conductive material layer 30 so as to come into direct contact with the surface of the conductive material layer 30. For example, the nanocrystalline graphene 50 may be doped with the above-described doping element.

In addition, as described above with reference to FIG. 2, the wiring structure 20 may include the conductive material layer 30, the nanocrystalline graphene 50 which is formed on the conductive material layer 30 so as to come into direct contact with the surface of the conductive material layer 30, and the graphene layer 70 transferred to the nanocrystalline graphene 50. For example, at least one of the nanocrystalline graphene 50 and the graphene layer 70 may be doped with the above-described doping element.

The wiring structures 10 and 20 may be used for connection between the plurality of elements and connection within each of the elements. In addition, the wiring structures 10 and 20 may be used for connection between unit cells each constituted by a combination of the plurality of elements. The wiring structures 10 and 20 may be used for connection between chips each constituted by the plurality of unit cells.

The electronic devices 100 and 150 having the wiring structures 10 and 20 according to example embodiments applied thereto, respectively, may greatly reduce specific resistance in the wiring structure, and thus it is possible to reduce a line width and wiring resistance.

Figure 7:
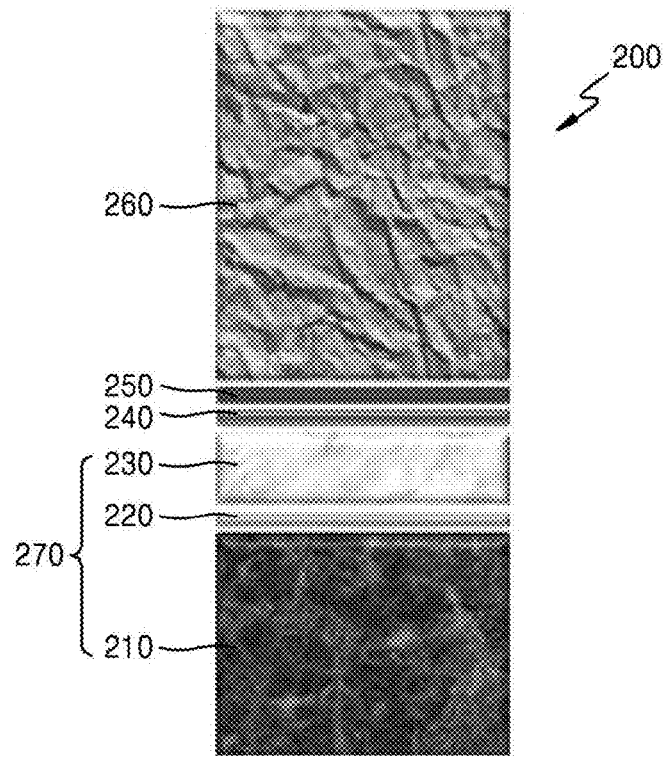
FIG. 7 is a schematic diagram illustrating a wiring structure having a multi-stack structure according to another example embodiment.
Figure 8:
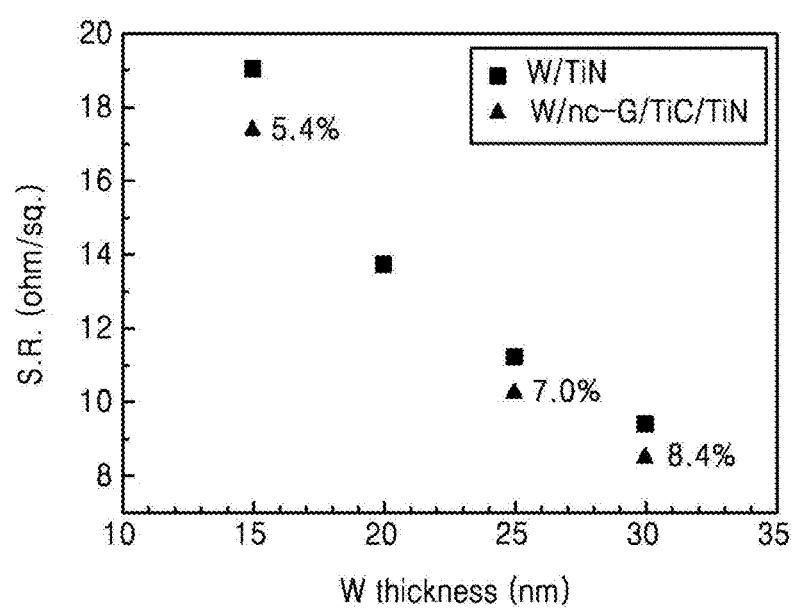
FIG. 8 is a graph illustrating changes in a resistance of a wiring structure into which graphene is inserted to present a resistance reduction effect in a structure into which nanocrystalline graphene (nc-G) is inserted, as compared with a W/TiN structure.

Up to now, an example where nanocrystalline graphene is directly grown on a conductive material layer, for example, a metal layer, has been described. However, the example embodiment is not limited thereto and nanocrystalline graphene may be formed on a conductive material layer through a seed layer. FIGS. 7 and 8 show example embodiments in which specific a resistance may be reduced by inserting graphene between wiring structures of a multi-stack structure. In order to provide the wiring structure between conductive material layers, a seed layer may be formed on one conductive material layer, nanocrystalline graphene may be directly grown on the seed layer, and another conductive material layer may subsequently be formed on the grown nanocrystalline graphene. According to such a structure, as the thickness of a general metal decreases, the specific resistance thereof substantially increases. On the other hand, graphene has a fixed specific resistance regardless of the thickness thereof. Accordingly, it is possible to reduce a specific resistance of a wiring structure while forming a thin wiring structure.

FIG. 7 is a schematic diagram showing a wiring structure 200 of a multi-stack structure according to another example embodiment.

Referring to FIG. 7, the wiring structure 200 includes a first conductive material layer 270, a seed layer 240 on the first conductive material layer 270, and a nanocrystalline graphene layer 50 on the seed layer 240. A second conductive material layer 260 may be further provided on the nanocrystalline graphene 50.

The first conductive material layer 270 may be a single layer or a multi-layer including at least one of a metal and Poly-Si. For example, the first conductive material layer 270 may be a single layer or a multi-layer of a material including a transition metal containing Ni, Cu, Co, Fe, or Ru, at least one of TiN, W, NiSi, CoSi, CuSi, FeSi, MnSi, RuSi, RhSi, IrSi, PtSi, TiSi, TiSiN, and WSi, or an alloy thereof, or Poly-Si.

For example, as shown in FIG. 7, the first conductive material layer 270 may have a multi-stack structure including a semiconductor material layer 210 having conductivity and a metal layer 230. An intermediate layer 220 may be at an interface between the semiconductor material layer 210 and the metal layer 230.

The semiconductor material layer 210 may be formed of or include, for example, Poly-Si. The metal layer 230 may be formed of or include, for example, TiN or TSN (TiSiN).

The intermediate layer 220 may be formed of or include, for example, a WSix layer. The second conductive material layer 260 may be formed of or include a metal, for example, tungsten (W).

The semiconductor material layer 210 may be formed of or include not only Poly-Si but also various semiconductor materials. The metal layer 230 and the second conductive material layer 260 may be formed of or include various metal materials in addition to the above-mentioned materials.

When a metal-carbon bonding layer formed by depositing carbide on an interface of the metal layer 230, for example, when the metal layer 230 is formed of or includes a material containing Ti such as TiN or TSN, the seed layer 240 may be a Ti—C layer. At this time, the seed layer 240 may have a thickness, for example, of approximately equal to or less than 1 nm. The nanocrystalline graphene 250 may be directly grown on the seed layer 240. When the nanocrystalline graphene 250 is grown using the seed layer 240 or the like, the nanocrystalline graphene 250 may have a higher quality.

Meanwhile, a metal material constituting the second conductive material layer 260, for example, tungsten (W), may be deposited on the nanocrystalline graphene 250. That is, the Ti—C layer, which is a thin metal-carbon bonding layer, is formed on the interface of TiN or TSN, nanocrystalline graphene is directly grown thereon by using the Ti—C layer as a seed layer, and then tungsten is deposited thereon, thereby forming a low-resistance wiring having a conductive material-graphene-conductive material wiring structure.

A wiring structure used for DRAM has a stacked structure of, for example, Poly-Si/TiN (or TSN)/W, and a WSix layer may be formed at an interface between the Poly-Si layer and the TiN (or TSN) layer and an interface between the TiN (or TSN) layer and the W layer. The stacked structure shown in FIG. 7 may be used as the wiring structure of the DRAM. That is, in the wiring structure of the DRAM, a seed layer, that is, a Ti—C layer, and nanocrystalline graphene directly grown on the Ti—C layer may be formed instead of forming the WSix layer at the interface between the TiN layer and the W layer. In addition, a seed layer, that is, an Si—C layer, and nanocrystalline graphene directly grown on the Si—C layer may be formed instead of forming the WSix layer at the interface between the Poly-Si layer and the TiN layer.

That is, FIG. 7 illustrates a case where the seed layer 240 and the nanocrystalline graphene 250 directly grown on the seed layer 240 are at an interface between the metal layer 230 and the second conductive material layer 260. However, the seed layer 240 and the nanocrystalline graphene 250 directly grown on the seed layer 240 may be at an interface between the semiconductor material layer 210 and the metal layer 230. In addition, the seed layer 240 and the nanocrystalline graphene 250 directly grown on the seed layer 240 may be at both the interface between the semiconductor material layer 210 and the metal layer 230 and at the interface between the metal layer 230 and the second conductive material layer 260.

FIG. 8 is a graph illustrating changes in a resistance of a wiring structure into which graphene is inserted to present a resistance reduction effect in a structure into which nanocrystalline graphene (nc-G) is inserted in comparison with a W/TiN structure. When the degree of reduction of the resistance is calculated in consideration of a thickness which increases according to the insertion of a graphene layer, it may be seen that the resistance is reduced by approximately 5.4% in a case where W is deposited to a thickness of 15 nm on the surface of nc-G/TiC/TiN, the resistance is reduced by approximately 7.0% in a case where W is deposited to a thickness of 25 nm thereon, and the resistance is reduced by approximately 8.4% in a case where W is deposited to a thickness of 30 nm thereon.

Figure 9:
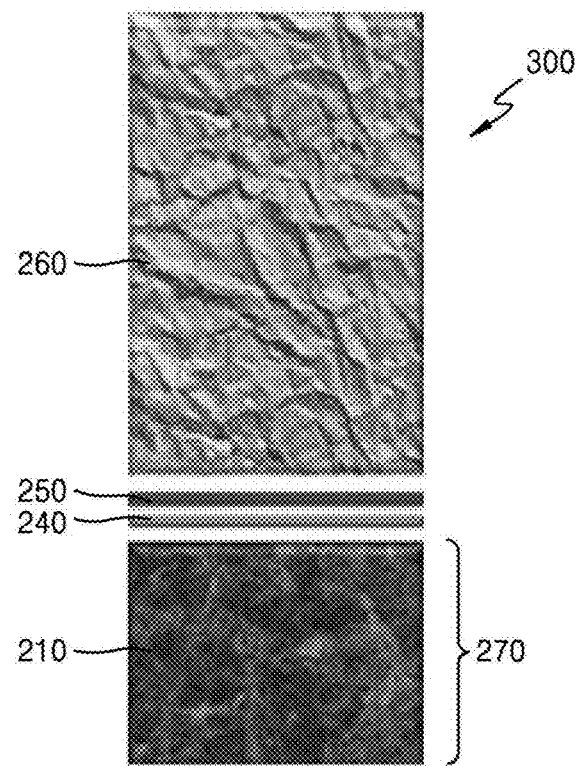
FIG. 9 is a schematic diagram illustrating a wiring structure having a multi-stack structure according to another example embodiment.

FIG. 9 is a schematic diagram showing a wiring structure 300 of a multi-stack structure according to another example embodiment. Compared with the wiring structure 200 of FIG. 7, a first conductive material layer 270 includes a semiconductor material layer 210, and a seed layer 240 and a nanocrystalline graphene 250 directly grown on the seed layer 240 may be formed at an interface between the first conductive material layer 270 and a second conductive material layer 260.

At this time, the first conductive material layer 270, that is, the semiconductor material layer 210, may be formed of or include, for example, Poly-Si. In this case, the seed layer 240 formed on the first conductive material layer 270 may be or include a Si—C seed layer.

In the wiring structure as shown in FIG. 9, the seed layer 240 and the nanocrystalline graphene 250 directly grown on the seed layer 240 are between the second conductive material layer 260 and the first conductive material layer 270 which is constituted by the semiconductor material layer 210. Thus, it is possible to reduce a resistance of the wiring structure 300 and substantially the entire thickness thereof, as compared with the structure of FIG. 7.

Also, in the cases of FIGS. 7 and 9, the nanocrystalline graphene 250 may be doped with the above-mentioned doping material so as to further reduce the resistance of the wiring structures 200 and 300.

In the above-mentioned wiring structure having the multi-stack structure, for example, a carbide (C) seed layer is between interface layers and may thereby form a Si—C or Ti—C bond, and nanocrystalline graphene is grown thereon by using the Si—C or Ti—C bond as a nucleation layer, thereby reducing the resistance of the entire wiring structure.

When the seed layer 240 and the nanocrystalline graphene 250 directly grown on the seed layer 240 are in an actual wiring structure used for a DRAM, a resistance of the actual wiring structure may be reduced up to a maximum of about 12.6%.

As described above, when graphene is directly grown by forming a Si—C or Ti—C bond or the like, a smooth and clean interface is formed as compared with a case when graphene is transferred. For this reason, it is possible to obtain a reduction of the resistance and an increase in the structural stability of a wiring structure, and the degree of reduction of the resistance is enough to satisfy the requirements for fabricating next generation devices or further generation devices. In addition, nanocrystalline graphene may reduce stress in comparison with general graphene, and thus, nanocrystalline graphene may be useful for the following process.

Figure 10:
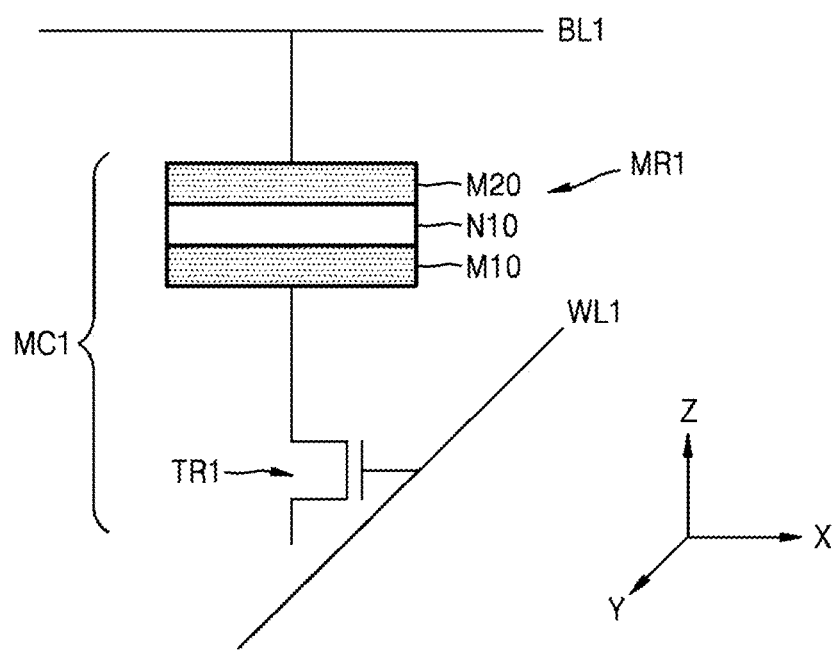
FIG. 10 is a schematic diagram illustrating a memory device which is an example of an electronic device.

FIG. 10 is a schematic diagram illustrating a memory device which is an example of an electronic device.

Referring to FIG. 10, the memory device of an example embodiment may include a memory cell MC1 which includes a magnetoresistive element MR1 and a switching element TR1 connected to the magnetoresistive element MR1. The memory cell MC1 may be connected between a bit line BL1 and a word line WL1.

The above-described wiring structures 10, 20, 200, and 300 according to example embodiments may be applied to at least one of the bit line BL1 and the word line WL1, for example, the bit line BL1.

The bit line BL1 and the word line WL1 may be prepared so as to intersect each other, and the memory cell MC1 may be positioned at an intersection. The bit line BL1 may be connected to the magnetoresistive element MR1. A second magnetic material layer M20 of the magnetoresistive element MR1 may be electrically connected to the bit line BL1. The word line WL1 may be connected to the switching element TR1. When the switching element TR1 is a transistor, the word line WL1 may be connected to a gate electrode of the switching element TR1. A write current, a read current, an erase current, and the like may be applied to the memory cell MC1 through the word line WL1 and the bit line BL1.

The magnetoresistive element MR1 may include the first and second magnetic material layers M10 and M20 and a non-magnetic layer N10 provided between the first and second magnetic material layers M10 and M20. One of the first and second magnetic material layers M10 and M20, for example, the first magnetic material layer, M10 may be a free layer, and the other, for example, the second magnetic material layer M20, may be a fixed layer.

The switching element TR1 may be, for example, a transistor. The switching element TR1 may be electrically connected to the first magnetic material layer M10 of the magnetoresistive element MR1.

Although FIG. 10 illustrates one memory cell MC1, a plurality of memory cells MC1 may be arranged so as to form an array, according to various example embodiments. That is, a plurality of bit lines BL1 and a plurality of word lines WL1 may be arranged so as to intersect each other, and a memory cell MC1 may be provided at each intersection.

Figure 11:
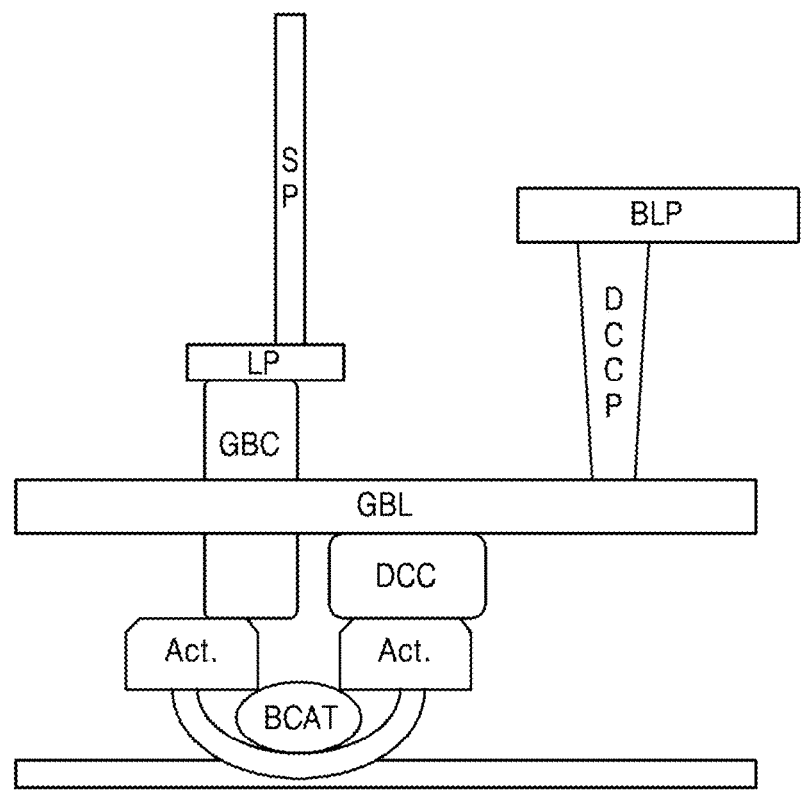
FIG. 11 is a schematic diagram illustrating dynamic random access memory (DRAM) which is another example of the electronic device.

FIG. 11 is a schematic diagram illustrating dynamic random access memory (DRAM) which is another example of the electronic device.

Referring to FIG. 11, a signal input through a gate bit line (GBL) from the DRAM is applied to an active layer Act on the lower side through a duty cycle correction unit DCC, and is then transmitted to an opposite active layer Act through a transistor operation of a buried channel array transistor (BCAT). The transmitted signal is stored as information in a capacitor SP through a gate body serial contact (GBC).

In such a DRAM, for example, the above-described wiring structures 10, 20, 200, and 300 according to example embodiments may be applied to the GBL.

The electronic device to which the wiring structures 10, 20, 200, and 300 according to example embodiments may be applied has been exemplified so far. However, the example embodiments are not limited thereto, and the wiring structures according to the example embodiments may be applied to various electronic devices requiring interconnection.

According to the wiring structure and the method of forming the same according to example embodiments, nanocrystalline graphene is directly grown on a conductive material layer or a seed layer which are used for a wiring structure. Thus, the wiring structure having a high adhesive strength to a surface of a metal and having a reduced resistance of a wiring may be realized.

It should be understood that the example embodiments described therein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope defined by the following claims.

What is claimed is:

1. A wiring structure comprising:
a first conductive material layer, the first conductive material layer being non- porous, and the first conductive material layer having a single-layered structure or a multi-layered structure including a material including at least a transition metal containing Ni, Cu, Co, or Fe, at least one of TiN, W, NiSi, CoSi, CuSi, FeSi, MnSi, RhSi, IrSi, PtSi, TiSi, TiSiN, and WSi, or an alloy thereof;
a nanocrystalline graphene layer on a substantial entirety of the first conductive material layer; and
a seed layer on the first conductive material layer, the seed layer including a carbide of a chemical element included in an uppermost layer of the first conductive material layer, the uppermost layer of the first conductive material layer contacting the seed layer,
wherein the nanocrystalline graphene layer is directly grown on the seed layer, and
wherein the nanocrystalline graphene layer has a ratio of 2D/G of a Raman spectrum which is equal to or greater than 0.05, and a ratio of D/G that is equal to or less than 2.

2. The wiring structure of claim 1, wherein the nanocrystalline graphene layer has at least one of a thickness of less than 20% of a thickness of the first conductive material layer, and a crystal size equal to or greater than 1 nm.

3. The wiring structure of claim 1, wherein the nanocrystalline graphene layer has a crystal size of about 1 nm to about 100 nm.

4. The wiring structure of claim 1, wherein the nanocrystalline graphene layer is formed on the first conductive material layer by deposition.

5. The wiring structure of claim 1, wherein the nanocrystalline graphene layer is on the first conductive material layer in direct contact with the first conductive material layer.

6. The wiring structure of claim 1, wherein the first conductive material layer is a metal layer.

7. The wiring structure of claim 1, wherein the seed layer has a thickness equal to or less than 1 nm.

8. The wiring structure of claim 1, further comprising a second conductive material layer on the nanocrystalline graphene layer.

9. The wiring structure of claim 8, further comprising a graphene layer onto the nanocrystalline graphene layer.

10. The wiring structure of claim 8, wherein the first conductive material layer comprises a Poly-Si layer and a metal layer, and the second conductive material layer includes a metallic material.

11. The wiring structure of claim 10, wherein the metal layer comprises TiN or TiSiN, the second conductive material layer includes W, and the seed layer includes Ti—C.

12. The wiring structure of claim 8, wherein the first conductive material layer comprises a Poly-Si layer, and the second conductive material layer includes a metallic material.

13. The wiring structure of claim 12, wherein the second conductive material layer comprises W, and the seed layer includes Si—C.

14. An electronic device comprising the wiring structure of claim 1.

15. The electronic device of claim 14, further comprising a plurality of elements,
wherein each of the plurality of elements includes at least one of a transistor, a capacitor, and a resistor, and
wherein the wiring structure is configured to connect the plurality of elements or to connect within at least one of the elements.

16. The electronic device of claim 15, wherein the wiring structure is configured to connect unit cells each constituted by a combination of the plurality of elements.

17. The electronic device of claim 16, wherein the wiring structure is configured to connect chips each constituted by the unit cells.

18. The electronic device of claim 14, further comprising a plurality of elements,
wherein each of the plurality of elements includes at least one of a transistor, a capacitor, and a resistor, and
wherein the wiring structure is configured to connect unit cells each constituted by a combination of the plurality of elements.

19. The wiring structure of claim 1, wherein the nanocrystalline graphene layer is substantially continuous.

20. The wiring structure of claim 1, wherein the nanocrystalline graphene layer is doped with a doping element including at least one of an organic p-dopant group including at least one of NO2BF4, NOBF4, NO2SbF6, HCl, H2PO4, CH3COOH, H2SO4, dichlorodicyanoquinone, oxon, dimyristoylphosphatidylinositol, and trifluoromethanesulfonic imide; an inorganic p-dopant group constituted by HPtCl4, HAuCl4, AgOTfs, AgNO3, H2PdCl6 Pd(OAc)2, and Cu(CN)2; an organic n-dopant group constituted by a reduced substance of substituted or unsubstituted nicotinamide, a reduced substance of a compound chemically bonded to substituted or unsubstituted nicotinamide, and a compound containing two or more pyridinum derivatives in a molecular structure and containing a reduced nitrogen within a ring of at least one pyridinum derivative; DDQ; and BV.

21. The wiring structure of claim 1, wherein
the first conductive material layer includes the transition metal in a metal layer, and
the carbide of the seed layer is formed by depositing carbide on an interface of the metal layer, wherein the nanocrystalline graphene layer is directly grown thereon by using the carbide.

22. A wiring structure comprising:
A conductive material layer, the conductive material layer having a single-layered structure or a multi-layered structure including a material including at least a transition metal containing Ni, Cu, Co, or Fe, at least one of TiN, W, NiSi, CoSi, CuSi, FeSi, MnSi, RhSi, IrSi, PtSi, TiSi, TiSiN, and Wsi, or an alloy thereof, or Poly-Si;
a nanocrystalline graphene layer on the conductive material layer in contact with the conductive material layer; and
a seed layer on the conductive material layer, wherein the nanocrystalline graphene layer is directly grown on the seed layer, the seed layer including a carbide of a chemical element included in an uppermost layer of the conductive material layer, the uppermost layer of the conductive material layer contacting the seed layer, and
a graphene layer formed on the nanocrystalline graphene layer,
wherein the nanocrystalline graphene layer has a ratio of 2D/G of a Raman spectrum which is equal to or greater than 0.05, and a ratio of D/G that is equal to or less than 2.

23. The wiring structure of claim 22, wherein the nanocrystalline graphene layer satisfies at least one of a thickness of less than 20% of a thickness of the conductive material layer, and a crystal size equal to or greater than 1 nm.

24. The wiring structure of claim 22, wherein the graphene layer is formed by transferring separately grown graphene.

25. The wiring structure of claim 22, wherein the graphene layer is configured as single-layered to thirty-layered graphene.

26. The wiring structure of claim 22, wherein the graphene layer has a thickness equal to or less than about 10 nm.

27. The wiring structure of claim 22, wherein the nanocrystalline graphene layer is substantially continuous.

28. The wiring structure of claim 22, wherein the nanocrystalline graphene layer is doped with a doping element including at least one of an organic p-dopant group including at least one of NO2BF4, NOBF4, NO2SbF6, HCl, H2PO4, CH3COOH, H2SO4, dichlorodicyanoquinone, oxon, dimyristoylphosphatidylinositol, and trifluoromethanesulfonic imide; an inorganic p-dopant group constituted by HPtCl4, HAuCl4, AgOTfs, AgNO3, H2PdCl6 Pd(OAc)2, and Cu(CN)2; an organic n-dopant group constituted by a reduced substance of substituted or unsubstituted nicotinamide, a reduced substance of a compound chemically bonded to substituted or unsubstituted nicotinamide, and a compound containing two or more pyridinum derivatives in a molecular structure and containing a reduced nitrogen within a ring of at least one pyridinum derivative; DDQ; and BV.

29. The wiring structure of claim 22, wherein
the conductive material layer includes the transition metal in a metal layer, and
the carbide of the seed layer is formed by depositing carbide on an interface of the metal layer, wherein the nanocrystalline graphene layer is directly grown thereon by using the carbide.

30. A wiring structure comprising:
a first conductive material layer, the first conductive material layer being non-porous;
a nanocrystalline graphene layer on a substantial entirety of the first conductive material layer;
a second conductive material layer on the nanocrystalline graphene layer; and
a seed layer on the first conductive material layer, the seed layer including a carbide of a chemical element included in an uppermost layer of the first conductive material layer, the uppermost layer of the first conductive material layer contacting the seed layer,
wherein the nanocrystalline graphene layer is directly grown on the seed layer, and
wherein the nanocrystalline graphene layer has a ratio of 2D/G of a Raman spectrum which is equal to or greater than 0.05, and a ratio of D/G that is equal to or less than 2,
wherein the first conductive material layer comprises a Poly-Si layer and a metal layer, and the second conductive material layer includes a metallic material, the metal layer including at least a transition metal containing Ni, Cu, Co, or Fe, at least one of TiN, W, NiSi, CoSi, CuSi, FeSi, MnSi, RhSi, IrSi, PtSi, TiSi, TiSiN, and Wsi, or an alloy thereof.

* * * * *